(12) United States Patent
Wertz

(10) Patent No.: US 8,593,813 B2
(45) Date of Patent: Nov. 26, 2013

(54) LOW PROFILE HEAT DISSIPATING SYSTEM WITH FREELY-ORIENTED HEAT PIPE

(75) Inventor: Darrell Lynn Wertz, Chandler, AZ (US)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 325 days.

(21) Appl. No.: 13/069,344

(22) Filed: Mar. 22, 2011

(65) Prior Publication Data

US 2012/0244742 A1    Sep. 27, 2012

(51) Int. Cl.
*H05K 7/20* (2006.01)
(52) U.S. Cl.
USPC ............................. 361/719; 439/485; 439/487
(58) Field of Classification Search
USPC ............ 361/719, 709, 711, 712, 704; 439/71, 439/55, 331, 73, 485, 487
See application file for complete search history.

(56) References Cited

U.S. PATENT DOCUMENTS

| 7,008,239 | B1 | 3/2006 | Ju |
| 7,589,972 | B2 | 9/2009 | Ma et al. |
| 7,619,895 | B1 | 11/2009 | Wertz et al. |
| 8,021,179 | B1 * | 9/2011 | Wertz ............................. 439/331 |
| 8,303,332 | B2 * | 11/2012 | Wertz ............................. 439/485 |

* cited by examiner

*Primary Examiner* — Javaid Nasri
(74) *Attorney, Agent, or Firm* — Wei Te Chung; Ming-Chieh Chang

(57) ABSTRACT

A heat dissipating system adapted to dissipate heat generated from an IC package mounted onto a socket connector, comprises a heat dissipating device comprising a heat spreader embedded with at least one heat pipe and a supporting plate flexibly seated upon an upper face of the heat spreader, and a clip located upon the heat dissipating device for pressing the heat dissipating device downward toward the socket connector.

14 Claims, 5 Drawing Sheets

LOW PROFILE HEAT DISSIPATING SYSTEM WITH FREELY-ORIENTED HEAT PIPE

BACKGROUND OF THE INVENTION

1. Field of the Invention

The present invention relates to a lower profile heat dissipating system incorporated with horizontally adjustable heat pipe, thereby suitable for an electrical connection system for compact application when the heat dissipating system is assembled to the electrical connection system.

2. Description of the Prior Art

U.S. Pat. No. 7,008,239, issued on Mar. 7, 2006, discloses a socket connector mounted on a printed circuit board (PCB). The socket includes an insulative housing, a plurality of contacts, four screw nuts and four screws, a lid and a heat pipe. The insulative housing has a plurality of slots for receiving the contacts and a border projecting therefrom and around the slots for orientating an electronic component, such as an IC (Integrated Circuit) module. The screw nuts connect the insulative housing to the PCB from a bottom side of the PCB. The screws engage with the screw nuts from a top side of the PCB. The lid is arranged between the screws and the insulative housing. A head of each screw presses the lid to urge the top surface of the IC module for positioning the IC module in the insulative housing. The heat pipe is assembled on a top surface of the lid and connects with a heat dissipation device for further heat dissipation. However, since the lid which is assembled with the heat pipe is firmly retained to the insulative housing, an extending direction of the heat pipe is fixed once the lid is assembled to the insulative housing. So mounting space on the printed circuit board for a heat dissipation which connects the heat pipe is limited. Moreover, the IC package may be damaged because the lid is directly and rigidly pressed on the IC package.

U.S. Pat. No. 7,589,972, issued to Ma on Sep. 15, 2009, discloses an socket connector assembly comprising an electrical socket with a plurality of contacts received therein, an IC module mounted onto the electrical socket so as to make electrical connection therebetween, a heat dissipating system comprising heat sink assembly pressing on the IC module and including a heat spreader and a clip fastening the heat sink assembly above the IC module. The IC module comprises a substrate and at least one die attached on a top surface of the substrate. The clip has a set of first fingers for pressing the die of the IC module and a set of second fingers for pressing the heat spreader. However, one disadvantage of Ma is the clip having second fingers downwardly for pressing the heat spreader, therefore whole height of the electrical connection is comparably bulky for the above-described application. Additional, in order to provide pressure force evenly distributed to the heat spreader and the IC package, the clip is formed with a number of spring fingers, thus having a complicated structure.

Accordingly, a new socket connector assembly that solves the above problems is desirable.

SUMMARY OF THE INVENTION

Accordingly, an object of the present invention is to provide a heat dissipating system which has flexibly orientated heat pipe.

Accordingly, another object of the present invention is to provide a heat dissipating system provided with flexible means distributing downward force evenly to a heat pipe retainer and an IC package therefore preventing potential warpage of the heat pipe and the IC package.

To fulfill the above object, a heat dissipating system adapted to dissipate heat generated from an IC package mounted onto a socket connector, comprises a heat dissipating device comprising a heat spreader embedded with at least one heat pipe and a supporting plate flexibly seated upon an upper face of the heat spreader, and a clip located upon the heat dissipating device for pressing the heat dissipating device downward toward the socket connector. Height of overall thermal solution is comparably lowered and suitable for low profile application. Moreover, the heat spreader is flexibly orientated under pressure of the clip.

Other objects, advantages and novel features of the present invention will become more apparent from the following detailed description when taken in conjunction with the accompanying drawings, in which:

DESCRIPTION OF PREFERRED EMBODIMENTS OF THE INVENTION

Reference is now made to the drawings to describe the invention in detail.

Referring to FIGS. 1-5, a socket connector assembly 3 in accordance with a preferred embodiment of the present invention is shown, which is adapted for electrically connecting an IC package 1 and a printed circuit board 2.

Figure 1:
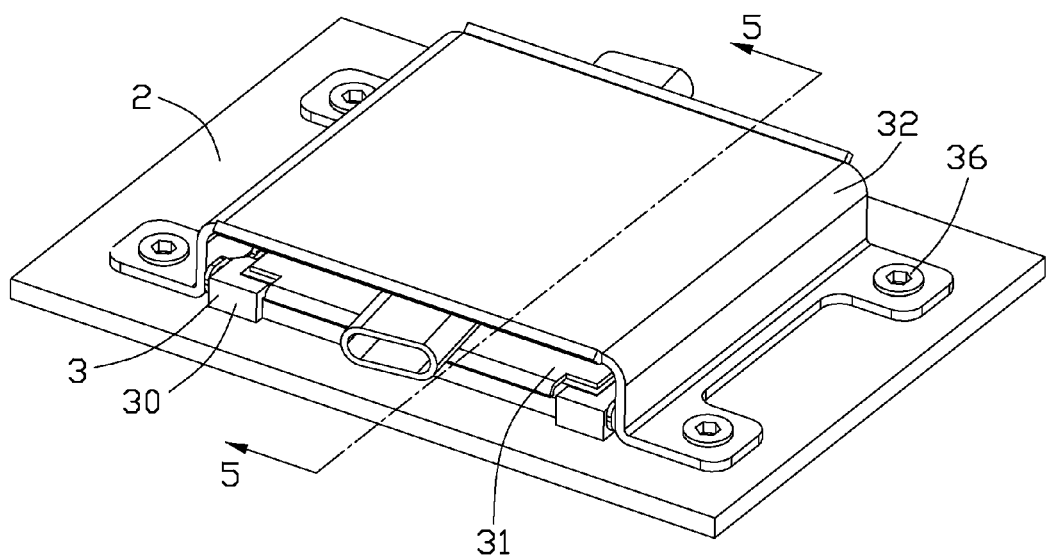
FIG. 1 is an assembled, perspective view of a socket connector assembly receiving an IC package and mounted on a printed circuit board, in accordance with the present invention.
Figure 2:
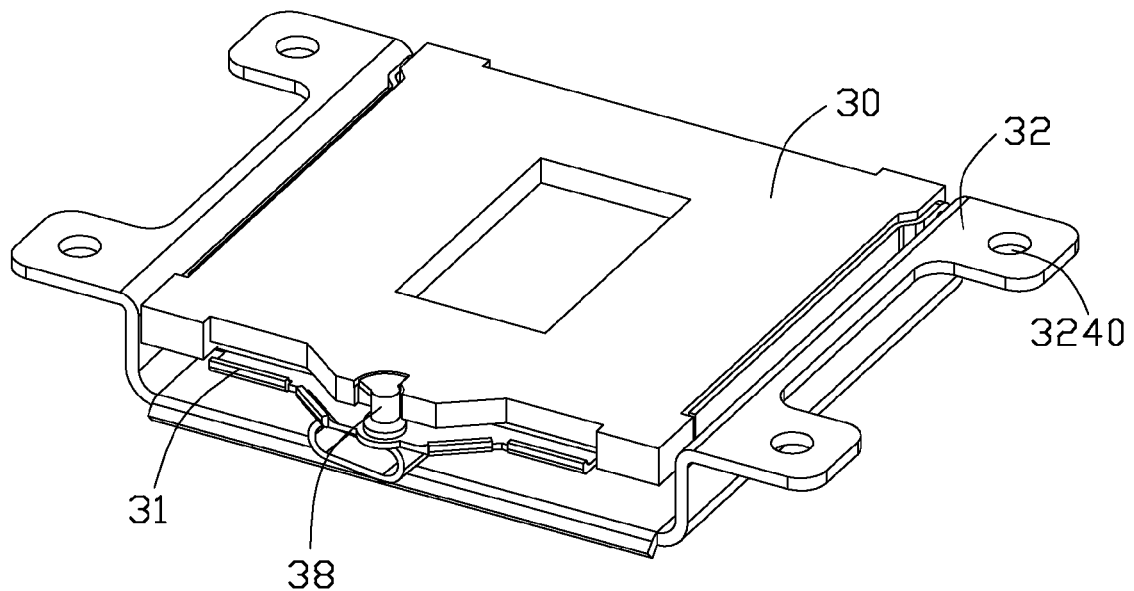
FIG. 2 is similar to FIG. 1, taken from a bottom side, wherein the printed circuit board is removed from the socket connector assembly.
Figure 3:
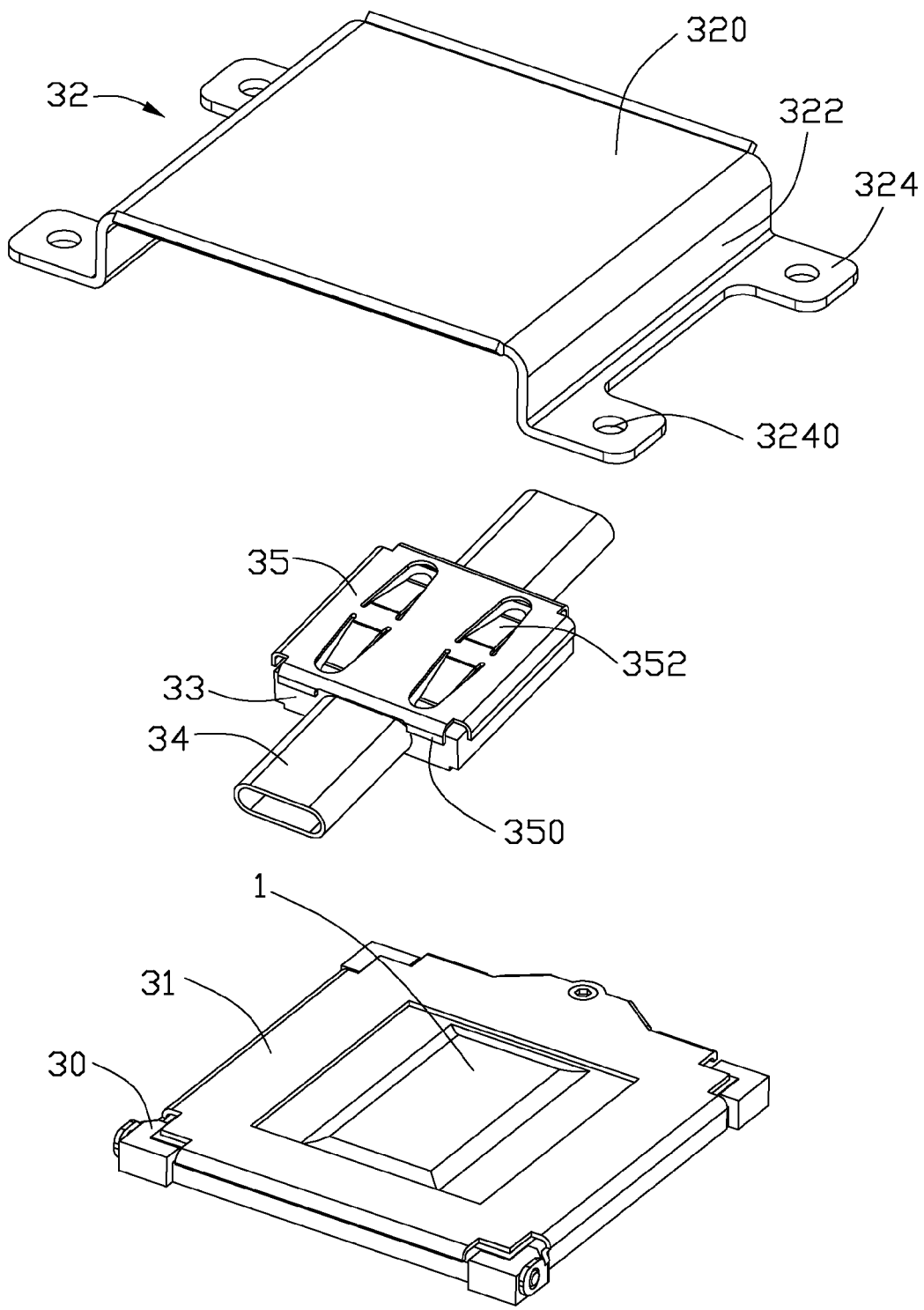
FIG. 3 is a partially assembled, perspective view of the assembly shown in FIG. 1, wherein a heat pipe retainer and cover plate are removed from the socket connector assembly.
Figure 4:
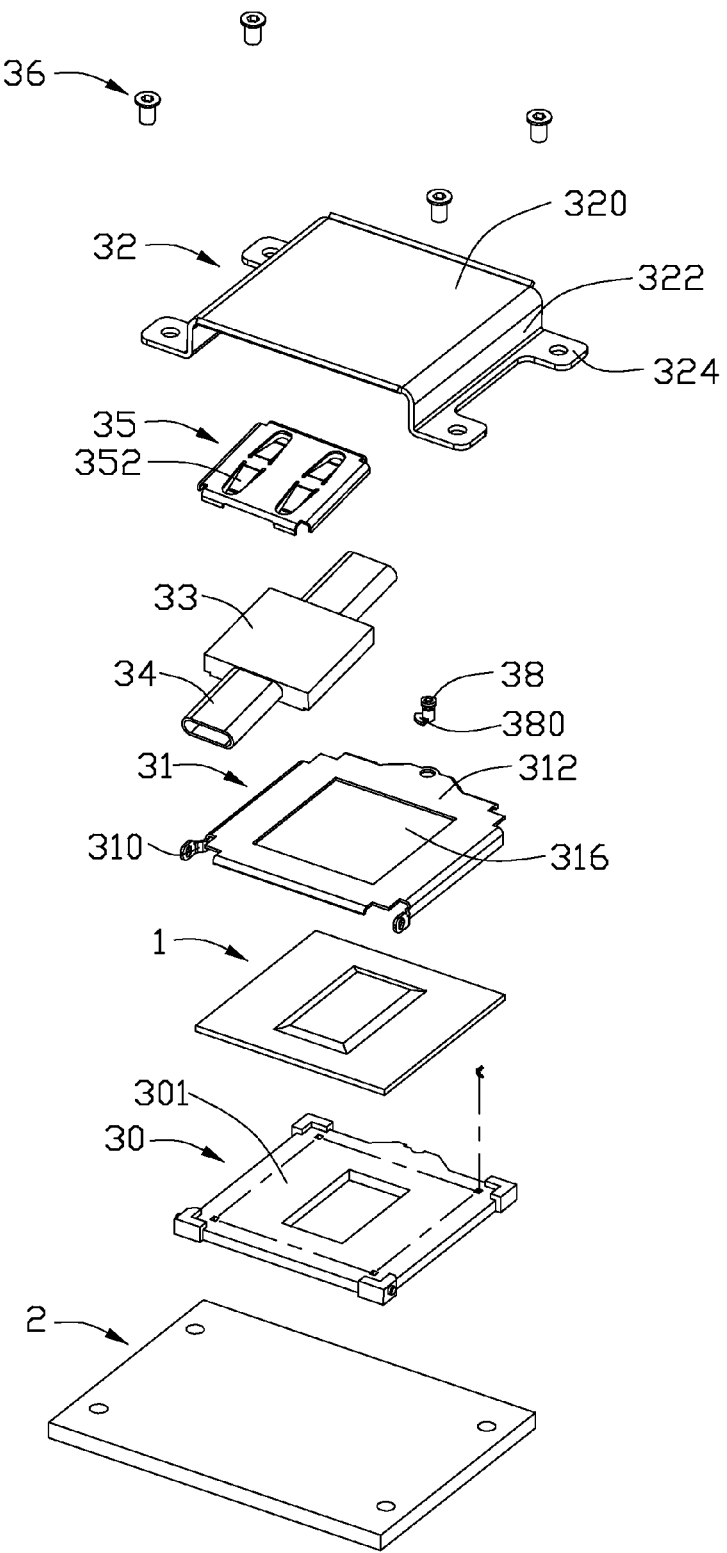
FIG. 4 is an exploded, perspective view of the assembly shown in FIG. 1.

The socket connector assembly 3 comprises an insulative housing 30, a protective plate 31, a clip 32, a heat spreader 33 embedded with one heat pipe 34, and a plurality of fastening members 36. One end of the protective plate 31 has two connecting portion 310 at opposite edges, which are pivotally mounted on opposite sidewalls of the insulative housing 30 thereby allowing the protective plate 31 to rotate relative to the housing 30. An opposite end of the protective plate 31 defines an extending portion 312 with an opening (not labeled) thereon. Referring to FIG. 2, when the protective plate 31 is at the closed position, a latch member 38 is formed with screw on one end (not labeled) thereof for engaging with the opening of the extending portion and a blade 380 on the other end for grasping a portion of the housing 30, thereby preventing rotation of the protective plate 31 when it is at the closed position. The heat spreader 33 with the heat pipes 34 are seated on the IC package 1 received in the insulative housing 30. The clip 32 is depressed upon on the heat spreader 33.

The insulative housing 30 defines a space 301 for receiving the IC package 1 and receiving a plurality of terminals (not labeled). The protective plate 31 is stamped from a metal piece and mounted on the housing 30. The protective plate 31 has an opening 316 corresponding to the space 301 of the housing 30, so as to allow the heat pipe 34 to be contacted with the IC package 1.

The clip 32 is located upon the heat spreader 33 and covers the insulating housing 30. The clip 32 comprises an elongate plate 320 and a pair of wings 322 extending downwardly from opposite edges of the elongate plate 320. The wings 322 each has a pair of mounting pads 324 bending from opposite ends thereof and extending along a horizontal direction. The mounting pads 324 each has a through hole 3240 thereon allowing the fastening members 34 to pass through. The elongate plate 320 is formed with a flat bottom surface for pressing supporting plate 35.

The heat spreader 33 has one heat pipes 34 assembled therein. A supporting plate 35 is seated on an upper face of the heat spreader 33. The supporting plate 35 defines a number of latches 350 for grasping edges of the heat spreader 33, and four spring fingers 352 extending downwardly therefrom. The four spring fingers 352 are evenly disposed and arranged on the supporting plate 35. As a result, the supporting plate is flexibly seated on the head spreader 33.

In an assembly process, the IC package 1 is received in the space 301 of the housing 30 and the heat spreader 33 is located upon the IC package 1 and contacting with the IC package 1. The clip 32 covers the heat spreader 33 with the flat bottom surface thereof downwardly pressing on upper portion of the supporting plate 33. The spring fingers 352 are evenly disposed with respect to a central portion of the supporting plate 35, thus the clip 32 can distribute downward force evenly to the heat spreader 33. Accordingly, electrical connection having thermal solution will be established between the printed circuit board 2 and the IC package 1.

Figure 5:
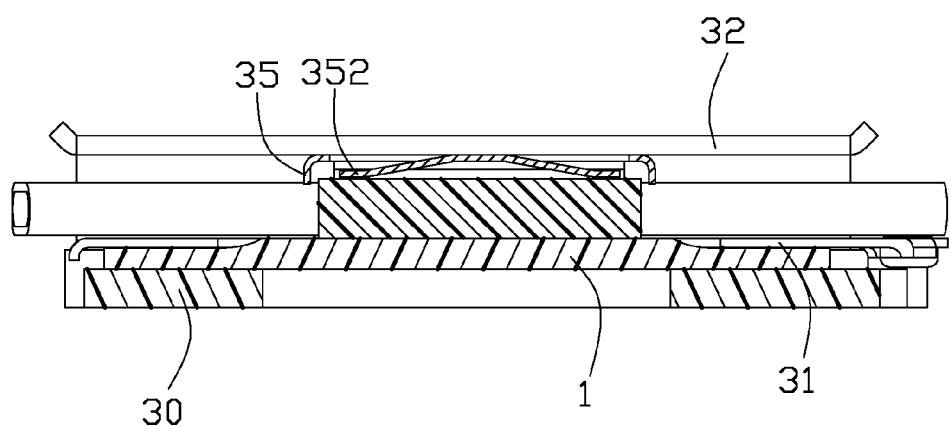
FIG. 5 is a cross-sectional view taken along line 5-5 in FIG. 1.

Referring to FIG. 5, after the clip 32 is fastened to the printed circuit board 2 by the fastening members 36, the spring fingers 352 is compressed under external force. Therefore, height of overall thermal solution is comparably lowered and suitable for thin application. Moreover, the elongate plate 320 of the clip 32 is of a plate-like structure for pressing the heat spreader 33, thus the clip has a simple structure with a lowered manufacturing cost. Furthermore, because the supporting plate 35 is flexibly seated on heat spreader 33, the heat spreader 33 is flexibly orientated under pressure of the clip 32.

Furthermore, although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. A heat dissipating system adapted to dissipate heat generated from an IC package mounted onto a socket connector, comprising:
   a heat dissipating device comprising a heat spreader embedded with at least one heat pipe and a supporting plate flexibly seated upon an upper face of the heat spreader; and
   a clip defining a solid flat plane located upon the supporting plate for pressing the heat dissipating device downward toward the socket connector; and wherein
   the solid flat plane is larger than the supporting plate.

2. The heat dissipating system of claim 1, wherein the supporting plate comprises latches grasping edges of the heat spreader and spring fingers downward so as to be seated on the upper face of the heat spreader.

3. The heat dissipating system of claim 2, wherein the spring finger is evenly arranged on the supporting plate.

4. The heat dissipating system of claim 2, wherein the springs extend downwardly from a middle portion of the supporting plate.

5. The heat dissipating system of claim 1, wherein the clip has a cover plate comprising an elongate plate for pressing the supporting plate and a pair of wings extending downwardly from opposite edges of the elongate plate, the wings each defining a pair of mounting pads bending from opposite ends thereof and extending along a horizontal direction.

6. The heat dissipating system of claim 5, wherein the mounting pads each define a through hole extending therethrough.

7. A socket connector assembly, comprising:
   a socket body defines a number of contacts received therein;
   an IC package mounted onto the socket body so as to establish electrical connection therebetween;
   a heat dissipating assembly including a heat spreader pressing on the IC package;
   a supporting plate flexibly assembled on an upper face of the heat spreader of the heat dissipating assembly; and
   a clip defining a flat solid plane pressing on and covering the supporting plate so as to distribute downward force to the heat spreader and the IC package, and protect the heat spreader and the IC package from dust.

8. The socket connector assembly of claim 7, wherein the heat spreader is embedded with at least one heat pipe.

9. The socket connector assembly of claim 8, wherein the supporting plate comprises latches grasping edges of the heat spreader and spring fingers downward so as to be seated on the upper face of the heat spreader.

10. The socket connector assembly of claim 9, wherein the spring fingers are evenly arranged on the supporting plate.

11. A socket assembly comprising:
    a printed circuit board;
    a connector mounted upon the printed circuit board and equipped with contacts;
    an electronic package mounted unto the connector and mechanically and electrically connected to the contacts;
    a protective plate associated and cooperating with the connector to sandwich the electronic package therebetween to assure connection between the connector and the electronic package;
    a heat spreader equipped with a heat pipe and vertically contacting the electronic package via an opening of the protective plate for heat dissipation;
    a clip mounted above the heat spreader and fastened to the printed circuit board; and
    a biasing device is formed between the clip and the heat spreader in a vertical direction to provide tension therebetween.

12. The socket assembly as claimed in claim 11, wherein said biasing device defining a plurality of latches roughly gripping the heat spreader for preventing relative movement between the biasing device and the heat spreader horizontally.

13. The socket assembly as claimed in claim 11, wherein said clip defines legs fastened to the printed circuit board.

14. The socket assembly as claimed in claim 11, wherein the protective cover retained to a periphery area of said connector.

* * * * *